United States Patent
Kim

[19]

[11] Patent Number: 6,127,248

[45] Date of Patent: Oct. 3, 2000

[54] FABRICATION METHOD FOR SEMICONDUCTOR DEVICE

[75] Inventor: Young-Gwan Kim, Cheongju, Rep. of Korea

[73] Assignee: Hyundai Electronics Industries Co., Ltd., Kyoungki-Do, Rep. of Korea

[21] Appl. No.: 09/114,154

[22] Filed: Jul. 13, 1998

[30] Foreign Application Priority Data

Feb. 27, 1998 [KR] Rep. of Korea ............... 98-6380

[51] Int. Cl.[7] .................................................. H01L 21/425
[52] U.S. Cl. .................. 438/528; 438/302; 438/274; 438/981
[58] Field of Search ........................... 438/263, 264, 438/302, 305, 306, 407, 528, 766, 549, 981, 525, 279; 257/339

[56] References Cited

U.S. PATENT DOCUMENTS

| | | | |
|---|---|---|---|
| 5,132,757 | 7/1992 | Tignor et al. | |
| 5,330,920 | 7/1994 | Soleimani et al. | 438/981 |
| 5,429,972 | 7/1995 | Anjum et al. | 438/528 |
| 5,516,707 | 5/1996 | Loh et al. | 438/302 |
| 5,610,430 | 3/1997 | Yamashita et al. | 257/412 |
| 5,648,282 | 7/1997 | Yoneda | 438/305 |
| 5,684,317 | 11/1997 | Hwang | 257/339 |
| 5,750,435 | 5/1998 | Pan | 438/525 |
| 5,840,600 | 11/1998 | Yamazaki et al. | 438/151 |
| 5,910,672 | 6/1999 | Iwamatsu et al. | 257/347 |
| 5,918,133 | 6/1999 | Gardner et al. | 438/299 |

OTHER PUBLICATIONS

C.T. Liu et al., "Light Nitrogen Implant for Preparing Thin–Gate Oxides", IEEE Electron Device Letter, vol. 18, No. 3, pp. 105–107, Mar. 1997.

*Primary Examiner*—Charles Bowers
*Assistant Examiner*—Jack Chen

[57] ABSTRACT

A fabrication method for a semiconductor device capable of adjusting a thickness of each portion of gate insulating film at both sides of a gate, which includes the steps of: providing a semiconductor substrate having a first region and a second region; forming a gate insulating film on the substrate; forming a conductive layer on the gate insulating film and patterning the conductive layer, for thereby forming a first gate and a second gate on the first and second regions, respectively; forming impurity areas in the first region at both sides of the first gate in order to reduce the velocity of oxidation; applying a re-oxidation process to the gate insulating film, for thereby forming each portion of the gate insulating film at both sides of the first gate thinner than each portion of the gate insulating film at both sides of the second gate; and respectively forming a source/drain region at both sides of the first and second gates.

16 Claims, 3 Drawing Sheets

(A)

(B)

(C)

(D)

(E)

FABRICATION METHOD FOR SEMICONDUCTOR DEVICE

BACKGROUND OF THE INVENTION

1. Field of the Invention

The present invention relates to a semiconductor device, and more particularly to a fabrication method for a semiconductor device capable of adjusting a thickness of each portion of gate insulating film at both sides of a gate.

2. Description of the Background Art

FIG. 1 is a vertical cross-sectional diagram of a conventional semiconductor device.

As shown therein, a predetermined portion of a gate insulating film 13b corresponding to a cell region 11b of a semiconductor substrate 11 is thickly formed by a gate re-oxidation process, and a mask 17 is formed on a portion of the gate insulating film 13a which corresponds to a periphery region 11a of the substrate 11 in order to prevent re-oxidation of a gate. The unexplained numerals, 15a and 15b, respectively indicate a gate, and 19 indicates a source/drain region.

Generally, according to the conventional semiconductor device, the gate re-oxidation process prevents damage of the gate insulating film occurred by etching or hot carrier stress of the gate and reduces gate induced drain leakage (GIDL). However, the gate re-oxidation process also reduces electrical properties such as a drain current and a threshold voltage, etc., thus a mask is formed on a predetermined area of the semiconductor device in order to prevent the re-oxidation of the gate.

However, because the gate re-oxidation process is essential to improve reliability of the gate insulating film, there is required a novel gate re-oxidation process that minimizes decrease of the drain current and threshold voltage, and further improves reliability of the semiconductor device.

SUMMARY OF THE INVENTION

Accordingly, an object of the present invention is to provide a fabrication method for a gate insulation film of a semiconductor device, capable of minimizing electrical properties such as the threshold voltage and drain current as well as preventing damage of a gate insulating film due to a gate etching process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabrication method for a semiconductor device includes: providing a semiconductor substrate having a first region and a second region; forming a gate insulating film on the substrate; forming a conductive layer on the gate insulating film and patterning the conductive layer, for thereby forming a first gate and a second gate on the first and second regions, respectively, of the semiconductor substrate; forming impurity areas in the first region at both sides of the first gate in order to reduce the velocity of oxidation; applying a re-oxidation process to the gate insulating film, for thereby forming each portion of the gate insulating film at both sides of the first gate thinner than each portion of the gate insulating film at both sides of the second gate; and respectively forming a source/drain region at both sides of the first and second gates.

In the invention, the impurity region is formed by a tilt ion implantation which applies a nitrogen ion.

The first region is a periphery region and the second region is a cell region.

The portions of the insulating film at both sides of the first gate respectively have a thickness that minimizes reduction of electrical properties such as a threshold voltage and a drain current, etc. and to prevent damage of the gate insulating film due to a gate patterning (etching) process, and the thickness thereof may be adjusted by density of impurity and energy in the impurity area.

In addition, the portions of the insulating film at both sides of the second gate are formed enough to reduce hot carrier stress and GIDL, and a thickness thereof may be adjusted by varying duration of the re-oxidation process.

It is to be understood that both the foregoing general description and the following detailed description are exemplary and explanatory and are intended to provide explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

FIGS. 2A–2E are vertical cross-sectional diagrams illustrating a fabrication method for a semiconductor device according to the present invention.

Figure 1:
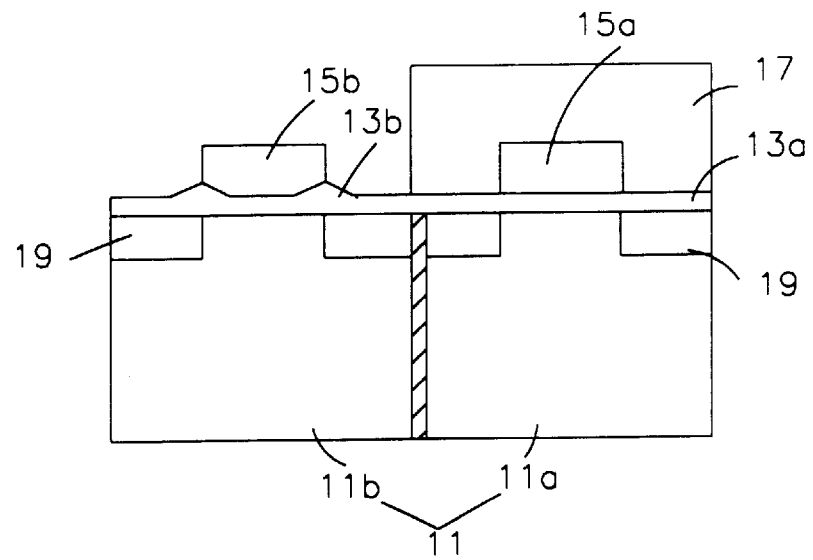
FIG. 1 is a vertical cross-sectional diagram of a conventional semiconductor device.
Figure 2:
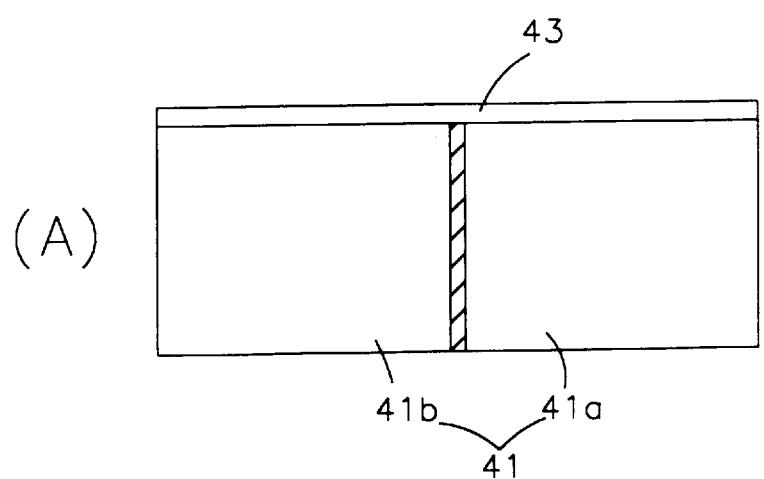
FIGS. 2A–2E are vertical cross-sectional diagrams illustrating a fabrication method for a semiconductor device according to the present invention.
Figure 2:
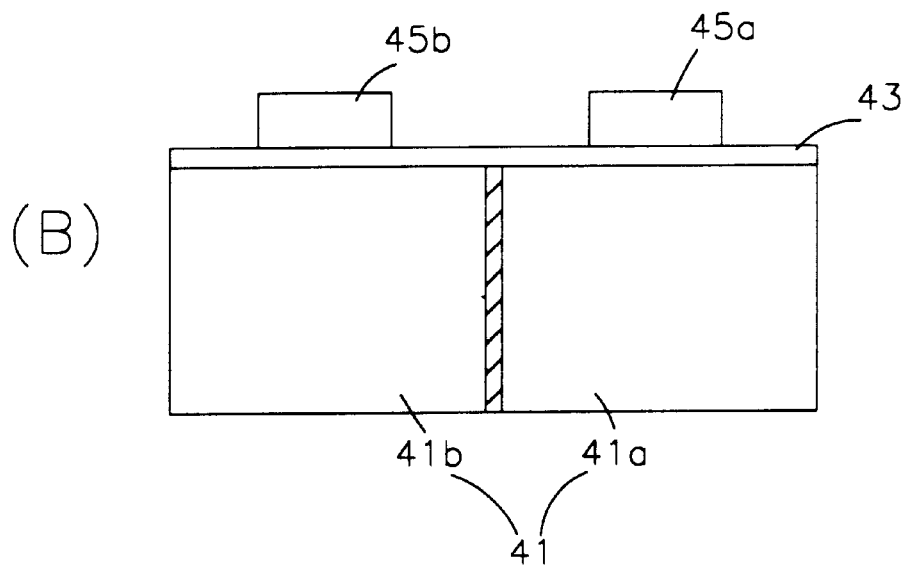
Figure 2:
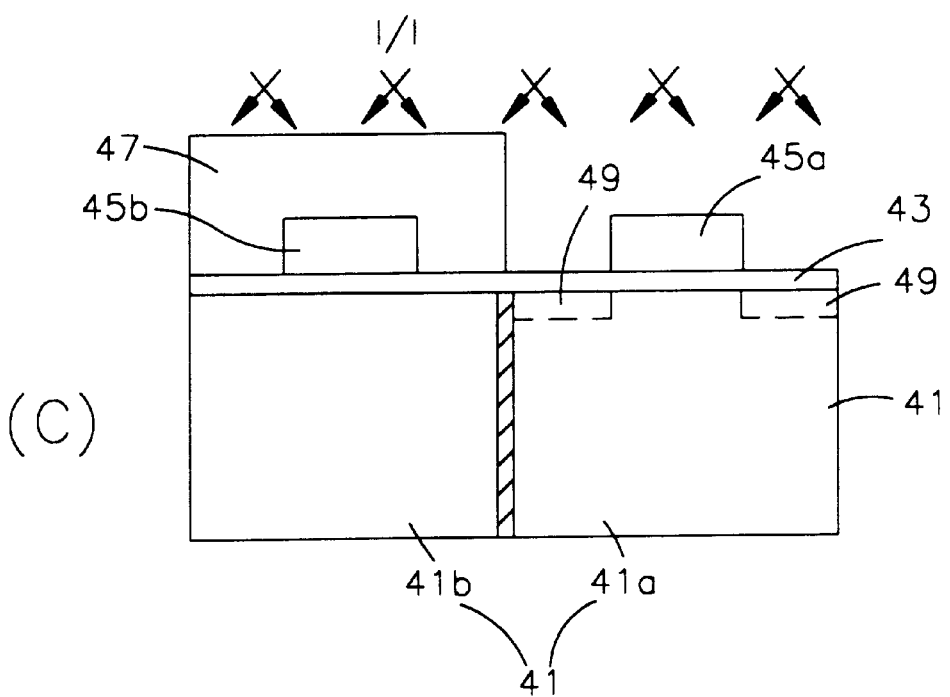
Figure 2:
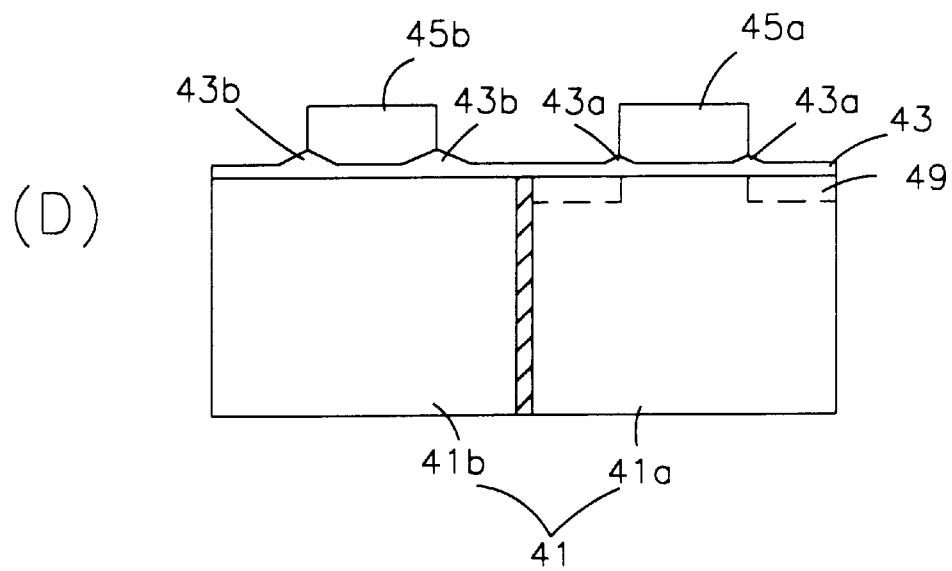
Figure 2:
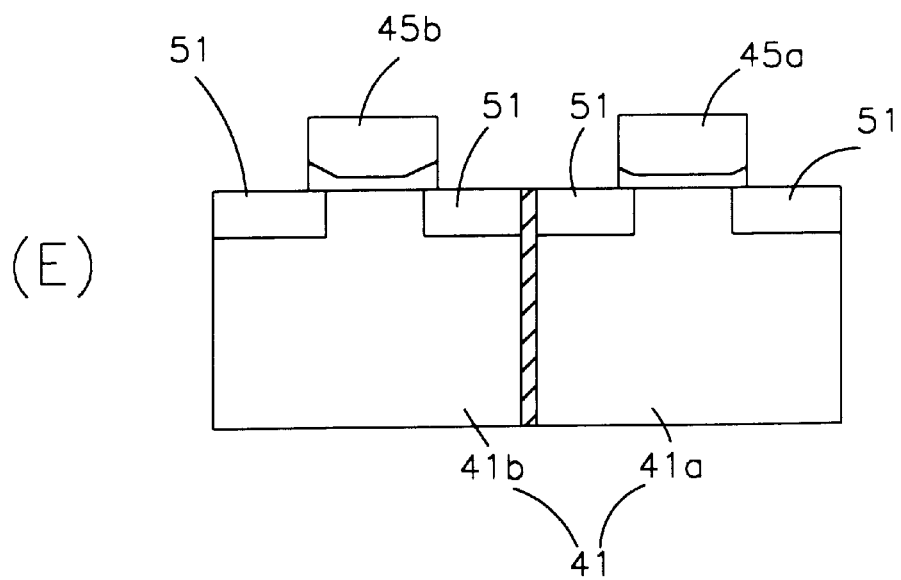

In FIG. 2A, first, there is provided a semiconductor substrate 41 having a first region 41a and a second region 41b, and a gate insulating film 43, an oxide film, is formed on the semiconductor substrate 41. Here, the first region 41a is a periphery region and the second region 41b is a cell region.

In FIG. 2B, a conductive layer (not shown) is formed on the gate insulating film 43, and the conductive layer is patterned, for thereby forming a first gate 45a and a second gate 45b. Here, the gate insulating film 43 is formed of the oxide film and the conductive layer is a poly silicon layer to form a gate. The first gate 45a and the second gate 45b are formed on the first region 41a and the second region 41b, respectively.

In FIG. 2C, a photoresist layer 47 is formed on the second gate 45b and a portion of the gate insulating film 43 which corresponds to the second region 41b of the semiconductor substrate 41. Here, an upper surface of the first region 41a is opened. Next, by using the photoresist layer 47 as a mask, nitrogen ions are implanted into the first region 41a of the semiconductor substrate 41 by a tilt ion implantation, for thereby forming nitrogen ion areas 49 in the first region 41a at both sides of the first gate 45a. Therefore, oxidation velocity is reduced by the nitrogen ion areas 49. That is, oxidation rate after the nitrogen ion implantation is reduced by 20–30% compared to before the nitrogen ion implantation.

As shown in FIG. 2D, a re-oxidation process is performed after removing the photoresist layer 47. Thus, each portion 43a of the insulating film 43 at both sides of the first gate 45a is formed thinner than portions 43b of the insulating film 43 at both sides of the second gate 45a, since the oxidation velocity is delayed at the portions 43a of the insulating film 43 at both sides of the first gate 45a by the nitrogen ion areas 49.

The portions 43a of the insulating film 43 at both sides of the first gate 45a respectively have a thickness which minimizes reduction of the electrical properties such as the threshold voltage and the drain current, etc. and to prevent damage of the gate insulating film 43 due to a patterning (etching) process of the first gate 45a. The thickness of the portions 43a of the insulating film 43 may be adjusted by density of ion and energy in the nitrogen ion areas 49. In addition, the portions 43b of the insulating film 43 at both sides of the second gate 45b are thickly formed enough to reduce hot carrier stress and GIDL. The thickness of the portions 43b may be adjusted by varying duration of the re-oxidation process.

Finally, in FIG. 2E, an exposed portion of the gate insulating film 43 is removed, except a portion of the gate insulating film 43 under the first and second gates 45a, 45b, respectively, and source/drain regions 51 are formed in the semiconductor substrate 41 at both sides of the first and second gates 45a, 45b, respectively.

As described above, the fabrication method for the semiconductor device according to the present invention may form the gate insulating film in the periphery region of the semiconductor device capable of minimizing reduction of electrical properties such as the threshold voltage and drain current as well as preventing damage of the gate insulating film due to the gate etching process. In addition, the invention may form the gate insulating film in the cell region of the semiconductor device that reduces the hot carrier stress and GIDL.

It will be apparent to those skilled in the art that various modifications and variations can be made in the fabrication method of the semiconductor device of the present invention without departing from the spirit or scope of the invention. Thus, it is intended that the present invention cover the modifications and variations of this invention provided they come within the scope of the appended claims and their equivalents.

What is claimed is:

1. A fabrication method for a semiconductor device, comprising:
    providing a semiconductor substrate having a first region and a second region;
    forming a gate insulating film on the substrate;
    forming a conductive layer on the gate insulating film and patterning the conductive layer, for thereby forming a first gate and a second gate on the first and second regions, respectively;
    forming impurity areas of an oxidation inhibitor in the first region at both sides of the first gate by,
        forming a mask over the second gate and the second region of the substrate, and
        ion implanting the oxidation inhibitor only in the first region of the substrate;
    applying a re-oxidation process to the gate insulating film, for thereby forming each portion of the gate insulating film at both sides of the first gate thinner than each portion of the gate insulating film at both sides of the second gate; and
    respectively forming a source/drain region at both sides of the first and second gates.

2. The fabrication method of claim 1, wherein the impurity areas are formed by tilt ion implantation.

3. The fabrication method of claim 2, wherein a nitrogen ion is tilt ion implanted as the oxidation inhibitor.

4. The fabrication method of claim 1, wherein the first region is a periphery region and the second region is a cell region.

5. The fabrication method of claim 1, wherein the portions of the gate insulating film at both sides of the first gate respectively have a thickness that minimizes reduction of electrical properties such as a threshold voltage and a drain current, and to prevent damage of the gate insulating film due to a gate patterning process.

6. The fabrication method of claim 5, wherein the thickness of each portion of the gate insulating film at both sides of the first gate is adjusted by density of the oxidation inhibitor and energy in the impurity areas.

7. The fabrication method of claim 1, wherein the portions of the gate insulating film at both sides of the second gate have a thickness that reduces hot carrier stress and gate induced drain leakage.

8. The fabrication method of claim 7, wherein the thickness of the portions of the gate insulating film at both sides of the second gate is adjusted by varying duration of the re-oxidation process.

9. A fabrication method for a semiconductor device comprising:
    providing a semiconductor substrate having a first region and a second region;
    forming a gate insulating film on the substrate in the first and second regions;
    forming a conductive layer on the gate insulating film;
    patterning the conductive layer to form a first gate and a second gate on the first and second regions, respectively;
    ion implanting an oxidation inhibitor in the substrate through the gate insulating film on both sides of the first gate by,
        forming a mask over the second gate and the second region of the substrate, and
        ion implanting the oxidation inhibitor only in the first region of the substrate;
    re-oxidizing the gate insulating film in the first and second regions; and
    forming respective source and drain regions in the substrate at respective first and second sides of the first and second gates.

10. The fabrication method of claim 9, wherein the re-oxidized gate insulating film at both sides of the first gate is thinner than the re-oxidized gate insulating film at both sides of the second gate.

11. The fabrication method of claim 10, wherein thickness of the re-oxidized gate insulating film at both sides of the first gate is a function of density of the oxidation inhibitor and energy of said step of ion implanting.

12. The fabrication method of claim 11, wherein thickness of the gate insulating film at both sides of the first gate is controlled to minimize reduction of a threshold voltage and a drain current and to prevent damage of the gate insulating film due to gate patterning of the first gate.

13. The fabrication method of claim 10, wherein thickness of the gate insulating film at both sides of the second gate is a function of duration of said step of re-oxidizing.

14. The fabrication method of claim 13, wherein the thickness of the gate insulating film at both sides of the second gate is controlled to reduce hot carrier stress and gate induced drain leakage.

15. The fabrication method of claim 9, wherein said step of ion implanting comprises tilt ion implanting.

16. The fabrication method of claim 9, wherein the oxidation inhibitor is a nitrogen ion.

* * * * *